(12) United States Patent
Isobe

(10) Patent No.: US 12,058,828 B2
(45) Date of Patent: Aug. 6, 2024

(54) HOUSING COVER STRUCTURE FOR SECURITY DEVICE

(71) Applicant: DENSO WAVE INCORPORATED, Aichi-pref. (JP)

(72) Inventor: Toshio Isobe, Chita-gun (JP)

(73) Assignee: DENSO WAVE INCORPORATED, Aichi-pref. (JP)

( * ) Notice: Subject to any disclaimer, the term of this patent is extended or adjusted under 35 U.S.C. 154(b) by 235 days.

(21) Appl. No.: 17/492,125

(22) Filed: Oct. 1, 2021

(65) Prior Publication Data

US 2022/0109226 A1 Apr. 7, 2022

(30) Foreign Application Priority Data

Oct. 1, 2020 (JP) ................................ 2020-166971

(51) Int. Cl.
*H05K 5/03* (2006.01)

(52) U.S. Cl.
CPC ..................................... *H05K 5/03* (2013.01)

(58) Field of Classification Search
CPC .................................. H01Q 1/42; B29C 45/16
See application file for complete search history.

(56) References Cited

U.S. PATENT DOCUMENTS

| | | | | |
|---|---|---|---|---|
| 5,386,084 A * | 1/1995 | Risko | ...................... | H05K 5/068 277/921 |
| 5,610,797 A * | 3/1997 | Nakamura | ........... | H04N 1/0049 361/679.21 |
| 6,535,202 B1 * | 3/2003 | Amari | ................... | H01H 13/705 341/23 |
| 7,957,524 B2 * | 6/2011 | Chipping | .............. | G06F 1/1626 206/320 |
| 2009/0304970 A1 * | 12/2009 | Imaizumi | .............. | B29C 45/062 428/38 |
| 2012/0018288 A1 * | 1/2012 | Rollet | ...................... | G06F 21/83 200/512 |
| 2012/0274219 A1 * | 11/2012 | Woytowitz | ............. | H05B 47/28 361/679.01 |
| 2014/0240911 A1 * | 8/2014 | Cole | ...................... | G02B 7/025 361/679.3 |
| 2015/0023047 A1 * | 1/2015 | Hori | ...................... | G02B 6/0008 362/551 |
| 2015/0306801 A1 * | 10/2015 | Ito | ........................... | B29C 45/16 428/137 |
| 2019/0154223 A1 * | 5/2019 | Mizutani | .......... | B29D 11/00865 |
| 2020/0026108 A1 * | 1/2020 | Metin | ................... | G06F 1/1656 |
| 2020/0101705 A1 * | 4/2020 | Sakamoto | ........... | B29C 45/1671 |
| 2021/0105905 A1 * | 4/2021 | Ren | ..................... | H04M 1/0202 |
| 2022/0043183 A1 * | 2/2022 | Motegi | .................. | G02B 5/003 |

FOREIGN PATENT DOCUMENTS

JP    2019-209481 A    12/2019

* cited by examiner

*Primary Examiner* — Abhishek M Rathod
(74) *Attorney, Agent, or Firm* — Oliff PLC

(57) ABSTRACT

A housing cover structure for a security device includes: a base member made of an optically non-transparent resin; and a window member made of an optically transparent resin. The window member is positioned adjacent to one side of the base member. The window member has: a window body exposed to outside; a first flange extending from the window body on the one side; and a second flange extending from the window body on the other side. The first flange and the second flange are combined within the base member. Each of the first flange and the second flange has a bent shape.

3 Claims, 5 Drawing Sheets

HOUSING COVER STRUCTURE FOR SECURITY DEVICE

CROSS REFERENCE TO RELATED APPLICATION

This application is based on Japanese Patent Application No. 2020-166971 filed on Oct. 1, 2020, the disclosure of which is incorporated herein by reference in its entirety.

TECHNICAL FIELD

The present disclosure relates to a housing cover structure for a security device.

BACKGROUND

A security device such as a radio frequency identifier (RFID), which reads a tag, has a housing made of a lower case and an upper case. A communication circuit is disposed in the lower case made of metal, and the lower case is covered with the upper case made of resin.

SUMMARY

According to an aspect of the present disclosure, a housing cover structure for a security device includes: a base member made of an optically non-transparent resin; and a window member made of an optically transparent resin. The window member is positioned adjacent to one side of the base member. The window member has a window body exposed to outside, a first flange extending from the window body on the one side, and a second flange extending from the window body on the other side. The first flange and the second flange are combined within the base member. Each of the first flange and the second flange has a bent shape.

DESCRIPTION OF EMBODIMENT

To begin with, examples of relevant techniques will be described.

A security device such as a radio frequency identifier (RFID), which reads a tag, has a housing made of a lower case and an upper case. A communication circuit is disposed in the lower case made of metal, and the lower case is covered with the upper case made of resin. The housing also houses a circuit that drives a light emitting diode (LED) that lights up in response to the operating state of the security device. The upper case has a window portion for transmitting the light of the LED to the outside so that the user can recognize. Therefore, the upper case is a two-color molded product having a base member made of an optically non-transparent resin and a window member made of an optically transparent resin.

Figure 10:
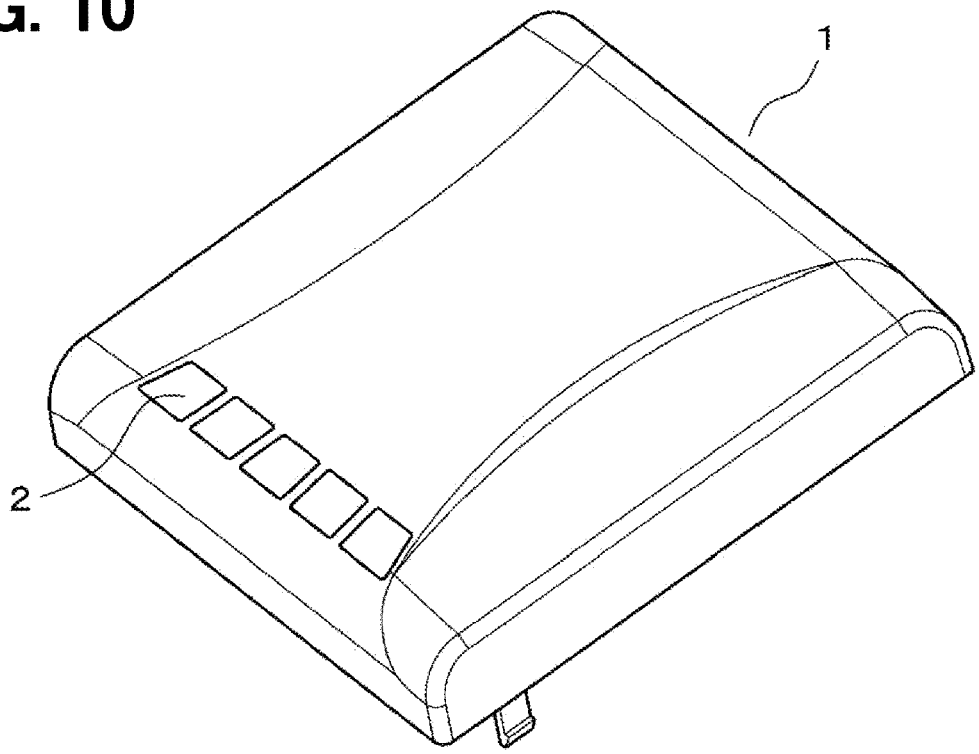
FIG. 10 is a view showing a comparison example corresponding to FIG. 1.
Figure 11:
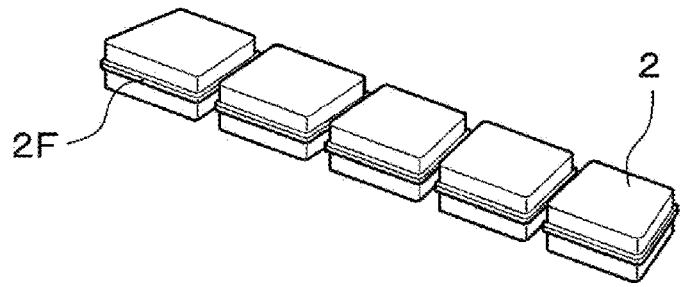
FIG. 11 is a view showing a comparison example corresponding to FIG. 2.
Figure 12:
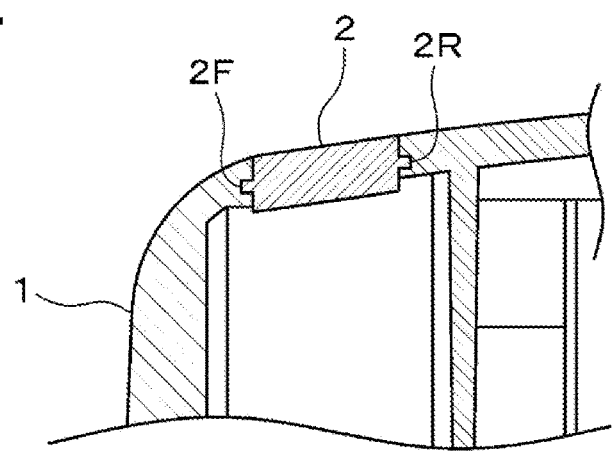
FIG. 12 is a view showing a comparison example corresponding to FIG. 3.

FIGS. 10 to 12 show a comparison example of the cover structure. The base member 1 is made of resin, such as PBT-GF30, having a coefficient of linear expansion close to that of metal. The window member 2 is made of a light-transmitting resin such as light-diffusing polycarbonate. The window member 2 has flanges 2F and 2R extending from the body in the left-right direction in FIG. 12, and is joined to the base member 1 through the flanges 2F and 2R at the manufacturing time.

There may be a water resistance standard, such as IPx6 in JIS, for the housing of the security device. However, cracks are likely to occur at the joint surface since the coefficient of linear expansion differs between the base member 1 and the window member 2, when a temperature stress is applied in case where the joint area is small. In this case, the close tightness between the base member 1 and the window member 2 may not be maintained. Further, when the window member 2 is stressed from the upper side in FIG. 12, the rigidity of the joint surface may be insufficient and the window member 2 may fall off downward.

The present disclosure provides a housing cover structure for a security device capable of more reliably maintaining the tightness between a window member and a base member.

According to an aspect of the present disclosure, a housing cover structure for a security device includes: a base member made of an optically non-transparent resin; and a window member made of an optically transparent resin. The window member is positioned adjacent to one side of the base member. The window member has: a window body exposed to outside; a first flange extending from the window body on the one side; and a second flange extending from the window body on the other side. The first flange and the second flange are combined within the base member, and each of the first flange and the second flange has a bent shape.

A larger joint area with the base member can be secured by making the shapes of the first flange and the second flange of the window member long enough to have the bent shape. As a result, the tightness between the base member and the window member can be improved and the rigidity against external stress can be maintained. Further, since the first flange and the second flange have the bent shape, the strength of the base member and the window member in close contact with each other can be further increased. Therefore, it is possible to restrict a crack from occurring at the interface between the base member and the window member.

The one side of the base member may also have a bent shape, and the bent shape of the first flange is along the bent shape of the one side of the base member. Therefore, it is possible to secure the length of the first flange to raise the tightness when the cover is designed such that the one side of the base member has the bent shape.

For example, each of the first flange and the second flange is shaped in that a tip side is thicker than a base side. With such a configuration, it is possible to increase the tightness strength between the base member and the window member and restrict a crack from occurring at the interface between the base member and the window member.

For example, the window body is one of a plurality of window bodies connected in an arrangement direction in which the plurality of window bodies are arranged. As a result, when the window bodies are provided on the cover of the housing, the interval between the window bodies is fixed in advance, so that the manufacturing can be easily performed.

For example, a slit is formed between the plurality of window bodies adjacent to each other. Since the resin forming the base member enters the slit when molding the housing cover, the tightness with the window member can be further improved.

First Embodiment

Figure 6:
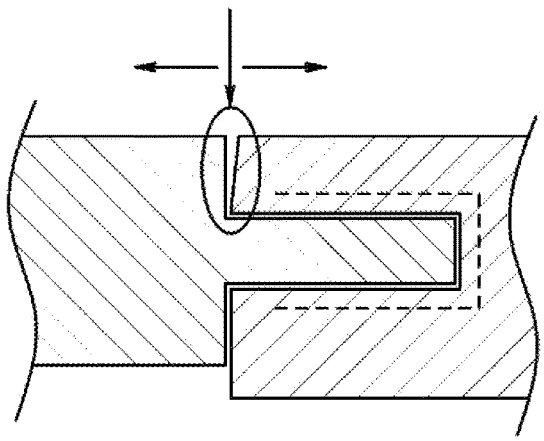
FIG. 6 is a schematic diagram showing a flange having a length similar to that of a second flange of the first embodiment, corresponding to FIG. 5.
Figure 7:
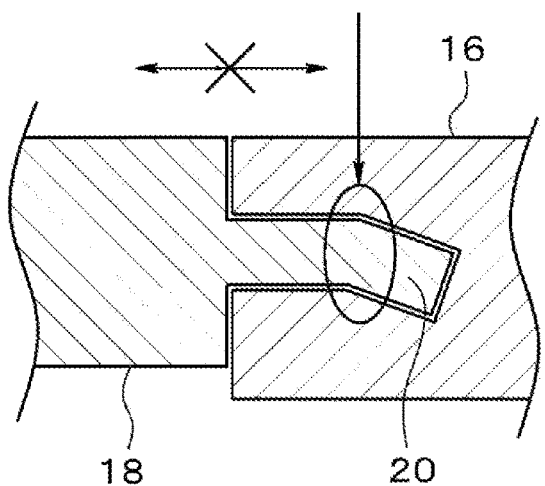
FIG. 7 is a schematic diagram showing the second flange of the first embodiment, corresponding to FIG. 5.
Figure 8:
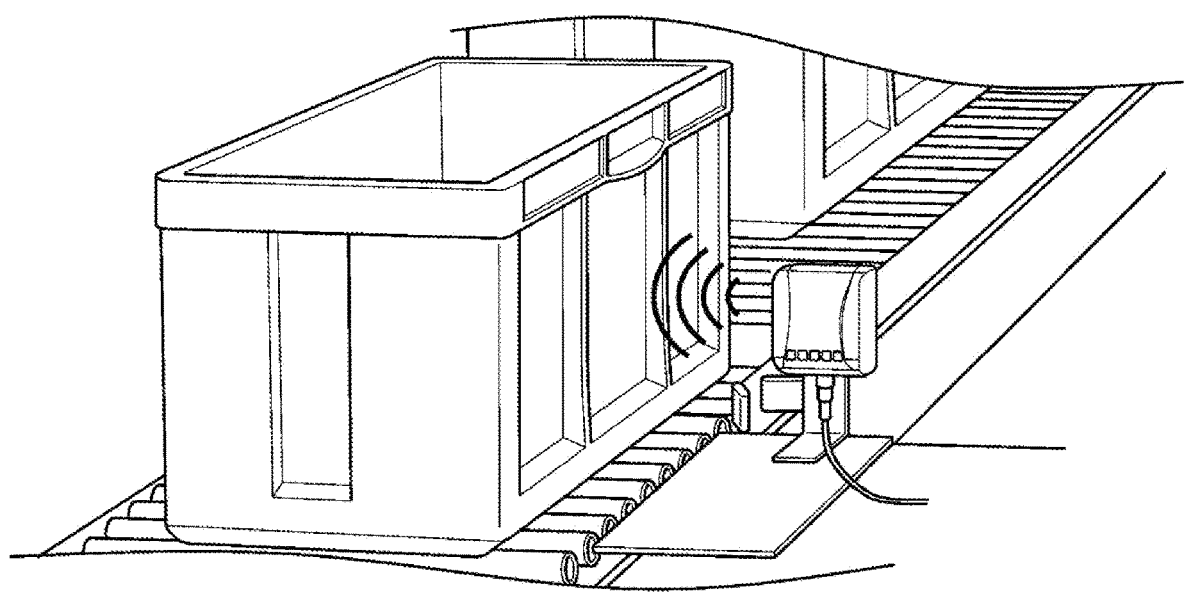
FIG. 8 is a diagram showing an actual usage pattern of the security device.

A first embodiment will be described with reference to FIGS. 1 to 8. FIG. 4 shows a housing 11 of a radio frequency identifier (RFID) such as tag reader, which is an example of a security device. The housing 11 includes, for example, a lower case 12 made of metal such as die-cast aluminum and an upper case 13 made of resin. The lower case 12 has a substantially rectangular box shape with an upper surface that is open, and a communication circuit (not shown) or the like is housed inside the lower case 12. FIG. 8 shows an example of an actual usage pattern of the RFID such as tag reader. The tag reader communicates with an RFID tag attached to a box by which components are transported on the production line, and reads the ID of the box. The read ID is used for lot management and the like.

A screw hole 14 for fixing the housing 11 is formed at four corners of the lower case 12. Further, the front of the lower case 12, as shown in FIG. 4, has three insertion holes 15 for inserting a cable connected to the communication circuit from the outside.

Figure 2:
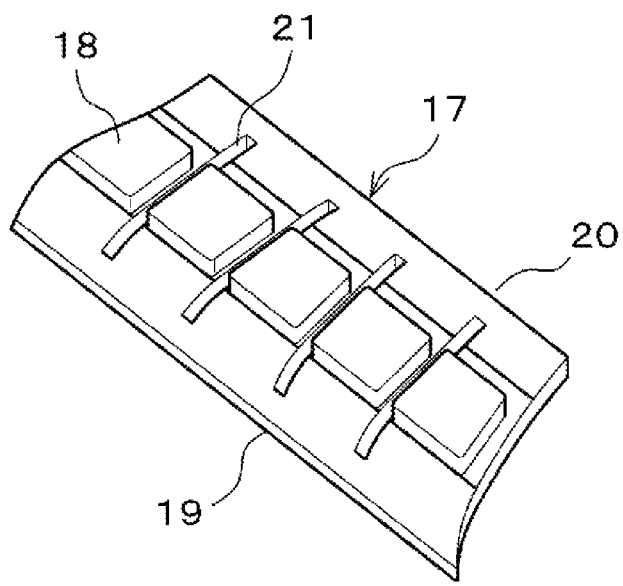
FIG. 2 is a perspective view showing a window member of the upper case.

The upper case 13 includes a base member 16 made of resin such as PBT-GF30, which does not transmit light, and a window member 17 arranged on the front side of the upper case 13. The window member 17 is made of resin such as light-diffusing polycarbonate which transmits light. A light emitting diode (LED) and a drive circuit thereof are also disposed on the lower case 12 together with the communication circuit, and the LED lights up in response to the operating state of the tag reader. The window member 17 is arranged so that the user can visually recognize the lighting state of the LED, and includes, for example, five window bodies 18. The window bodies 18 are integrally formed with the window member 17, as shown in FIG. 2.

Each of the window bodies 18 forms a substantially rectangular window, and the window member 17 has a first flange 19 and a second flange 20. The first flange 19 extends forward from one side of each window body 18, and the second flange 20 extends rearward from the other side of each window body 18. Some of the window bodies 18 located at the ends in the arrangement direction have a trapezoidal shape that matches the design of the base member 16. Further, a slit 21 is formed between the window bodies 18 adjacent to each other. The upper case 13 corresponds to a housing cover.

Figure 1:
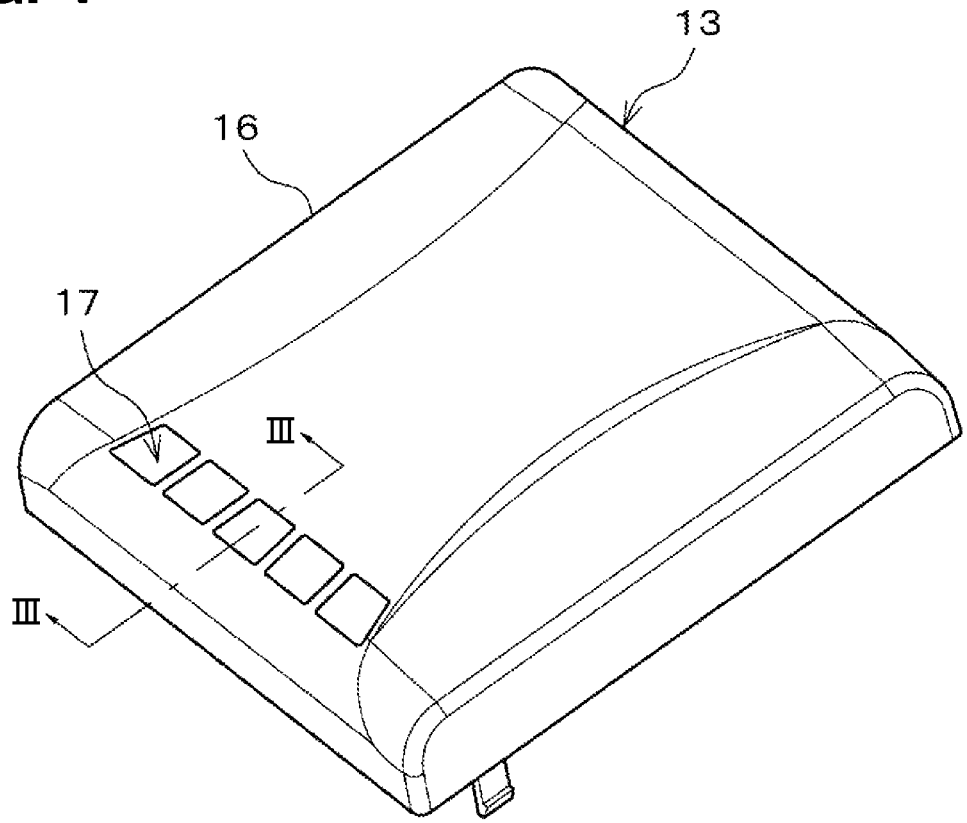
FIG. 1 is a perspective view showing an upper case of a security device according to a first embodiment.
Figure 3:
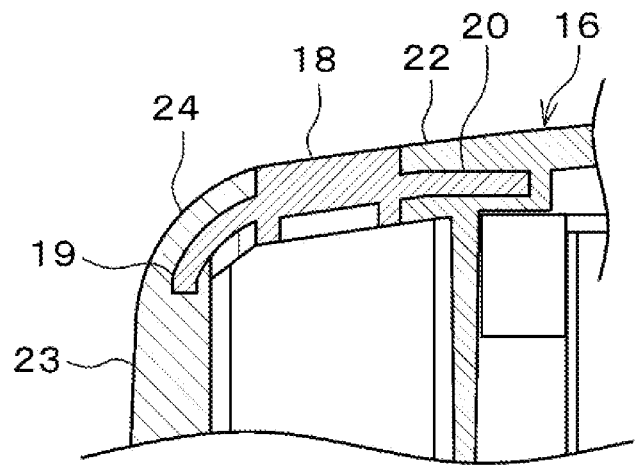
FIG. 3 is a cross-sectional view taken along a line III-III of FIG. 1.
Figure 4:
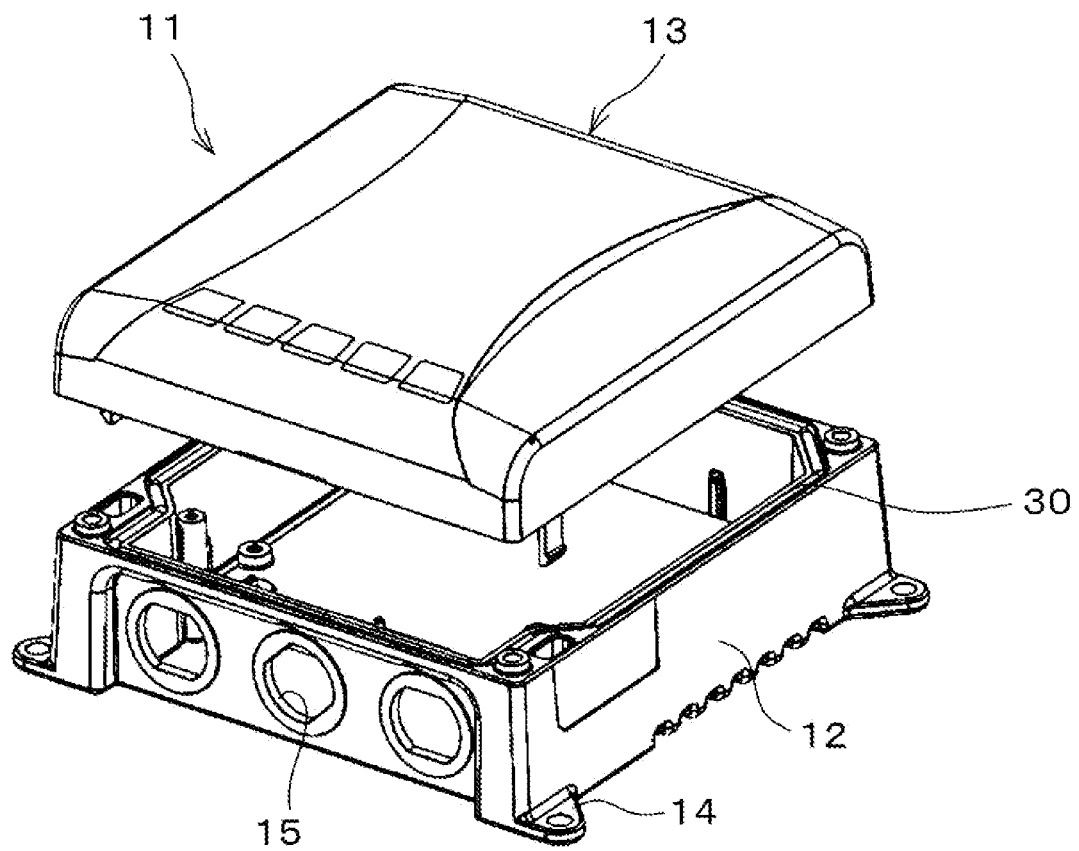
FIG. 4 is a perspective view showing a lower case in addition to the upper case.

FIG. 3 shows a cross section taken along a line III-III of FIG. 1. The base member 16 has an obtuse-angled bent portion 24 between the upper surface 22 and the front surface 23 on the left side in FIG. 3. The first flange 19 has a bent shape that matches the bent shape of the bent portion 24. The tip portion of the first flange 19 faces downward so as to extend parallel to the front surface 23. Further, the second flange 20 has a bent shape that is bent downward at the middle. The upper case 13 is formed by molding the base member 16 and the window member 17 in two-color molding. The first flange 19 and the second flange 20 are combined with the base member 16 when being molded.

Figure 5:
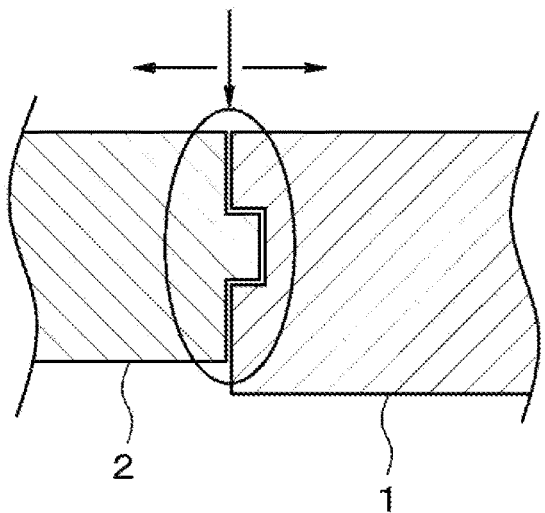
FIG. 5 is a schematic diagram showing a joining interface between a base member and a window member in a comparison example.

FIG. 5 shows a typical joining interface between the base member 1 and the window member 2 of the comparison example shown in FIG. 10. FIG. 7 shows a joining interface between the second flange 20 and the base member 16 in the first embodiment. In the comparison example shown in FIG. 5, the adhesion of the joint surface is weak. In the worst case, a crack penetrates the interface between the base member 1 and the window member 2. In contrast, as shown in FIG. 6, if a flange has a length similar to that of the second flange 20 of the present embodiment, the joint area between the base member 16 and the window member 17 is large. Even if a crack is generated, the crack can be restricted from penetrating the upper case 13.

As the second flange 20 of the present embodiment has the shape that is bent downward, the joint surface between the second flange 20 and the base member 16 is also bent. Therefore, the tightness between the second flange 20 and the base member 16 is improved. As an example, while the lateral length of the joint surface of the comparison example in FIG. 5 is 3.7 mm, the lateral length of the joint surface in the present embodiment can be secured as about 20.5 mm, due to the second flange 20.

According to the present embodiment, the upper case 13 includes the base member 16 made of resin having no light transmission property and the window member 17 made of resin having light transmission property. The window member 17 has the window body 18 exposed to the outside. The window member 17 is arranged closer to one side of the base member 16. The window member 17 includes the first flange 19 extending from the window body 18 on the one side and the second flange 20 extending from the window body 18 on the other side. Both of the first flange 19 and the second flange have the bent shape.

When the first flange 19 and the second flange 20 are long enough to have the bent shape, a larger joint area between the window member 17 and the base member 16 can be secured. As a result, the adhesion tightness between the window member 17 and the base member 16 can be improved. Therefore, the rigidity can be maintained against external stress such as temperature stress, for example, applied from the upper side in FIG. 3 to the window body 18. Further, since the first flange 19 and the second flange 20 have the bent shape, the strength of the window member 17 and the base member 16 in close contact with each other can be further increased. Thus, the interface between the base member 16 and the window member 17 can be restricted from separating from each other.

Since the first flange 19 has the bent shape along the bent shape of the one side of the base member 16, the length of the first flange 19 can be secured. Thus, the adhesion tightness can be improved. Further, since the window bodies 18 are connected in the arrangement direction in which the window bodies 18 are arranged, the interval between the window bodies 18 is fixed in advance, when the windows are provided in the upper case 13. Thus, the molding can be easily performed. In addition, since the slit 21 is formed between the adjacent window bodies 18, the resin forming the base member 16 enters the slit 21 when the upper case 13 is molded, so that the adhesion strength with the window member 17 can be further improved.

Second Embodiment

Figure 9:
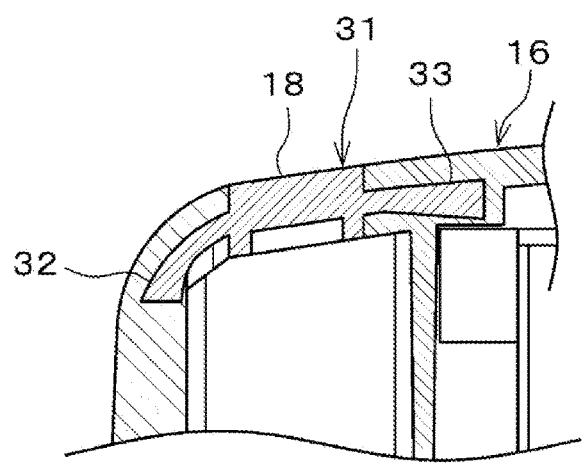
FIG. 9 is a cross-sectional view according to a second embodiment, corresponding to FIG. 3.

Hereinafter, the same parts as those in the first embodiment are designated by the same reference numerals and explanations thereof are omitted. As shown in FIG. 9, the window member 31 of the second embodiment includes a first flange 32 and a second flange 33 instead of the first flange 19 and the second flange 20. Each of the first flange 32 and the second flange 33 has a shape in which the tip side is thicker than the base side. With such a configuration, it is possible to increase the adhesion strength between the base member 16 and the window member 31 so as to restrict the base member 16 and the window member 31 from separating from each other at the interface.

The present disclosure is not limited to the embodiments described above or shown in the drawings, and may be modified as follows.

The bent directions and angles of the first and second flanges may be the same or different. The slit 21 may be formed as needed. It is not always necessary to connect the window bodies 18. The number of the window bodies 18 is at least one.

The base member is not limited to be made of PBT-GF30, and the window member is not limited to be made of the light diffusing polycarbonate, while the base member is made of resin which is optically non-transparent and the window member is made of resin which is optically transparent. The security device is not limited to the RFID tag reader.

What is claimed is:

1. A housing cover structure for a security device, comprising:
   a base member made of an optically non-transparent resin; and
   a window member made of an optically transparent resin, wherein
   the window member is positioned adjacent to one side of the base member,
   the window member has
      a window body exposed to outside,
      a first flange extending from the window body on the one side, and
      a second flange extending from the window body on the other side,
   the first flange and the second flange are combined within the base member,
   an upper surface and a lower surface of each of the first flange and the second flange are in contact with the base member, and
   each of the first flange and the second flange has a bent shape,
   the window body is one of a plurality of window bodies connected in an arrangement direction in which the plurality of window bodies are arranged, and
   a slit is formed between the plurality of window bodies adjacent to each other.

2. The housing cover structure according to claim 1, wherein
   the one side of the base member has a bent shape, and
   the bent shape of the first flange is along the bent shape of the one side of the base member.

3. The housing cover structure according to claim 1, wherein
   the first flange is thicker at a tip side of the first flange than a base side of the first flange, and
   the second flange is thicker at a tip side of the second flange than a base side of the second flange.

* * * * *